US012665007B2

(12) United States Patent
Plavec et al.

(10) Patent No.: US 12,665,007 B2
(45) Date of Patent: Jun. 23, 2026

(54) ADDRESS DECODER UNIT FOR A MEMORY CELL ARRAY USING LOGIC GATES

(71) Applicant: EM Microelectronic-Marin SA, Marin (CH)

(72) Inventors: Lubomir Plavec, Brno (CZ); Yves Godat, Cornaux (CH)

(73) Assignee: EM MICROELECTRONIC-MARIN SA, Marin (CH)

( * ) Notice: Subject to any disclaimer, the term of this patent is extended or adjusted under 35 U.S.C. 154(b) by 190 days.

(21) Appl. No.: 18/474,406

(22) Filed: Sep. 26, 2023

(65) Prior Publication Data

US 2024/0127875 A1      Apr. 18, 2024

(30) Foreign Application Priority Data

Oct. 14, 2022    (EP) ..................................... 22201697

(51) Int. Cl.
  *G11C 8/10* (2006.01)
  *G11C 8/08* (2006.01)
  *H03K 19/20* (2006.01)
(52) U.S. Cl.
  CPC .................. *G11C 8/10* (2013.01); *G11C 8/08* (2013.01); *H03K 19/20* (2013.01)
(58) Field of Classification Search
  CPC .... G11C 8/10; G11C 8/08; G11C 7/20; G11C 16/20; G11C 16/08; H03K 19/20
  See application file for complete search history.

(56) References Cited

U.S. PATENT DOCUMENTS

| | | | | |
|---|---|---|---|---|
| 6,111,792 A | * | 8/2000 | Oku ......................... | G11C 8/12 |
| | | | | 365/185.12 |
| 2006/0018145 A1 | | 1/2006 | Kim | |
| 2016/0267995 A1 | * | 9/2016 | Chang ................ | G11C 16/0475 |
| 2020/0159440 A1 | | 5/2020 | Schmidt et al. | |
| 2023/0072218 A1 | * | 3/2023 | Kim ......................... | G11C 16/10 |
| 2023/0154541 A1 | * | 5/2023 | Yuan .................. | G11C 16/3445 |
| | | | | 365/185.29 |

OTHER PUBLICATIONS

European Search Report for EP 22 20 1697 dated Mar. 3, 2023.

* cited by examiner

*Primary Examiner* — Donald HB Braswell
(74) *Attorney, Agent, or Firm* — Sughrue Mion, PLLC

(57) ABSTRACT

An address decoder unit (30) for a memory cell array (10), the address decoder unit (30) including an address decoder (31) including an address input (33) and a number of address outputs (34, 35, 36), the address decoder (31) being operable to select one of the address outputs (34, 35, 36) in response to receive a memory address at the address input (33); and an address selection circuitry (32) connected to the address decoder (31) and including a number of address selection outputs (44, 45, 46) each of which connectable the memory cell array and each of which corresponding to one memory address, wherein the address decoder unit (30) is switchable into a memory erase mode, in which the address selection circuitry (32) is operable to select all address selection outputs (44, 45, 46) of an address space above or beyond a memory address provided at the address input (33).

15 Claims, 4 Drawing Sheets

ADDRESS DECODER UNIT FOR A MEMORY CELL ARRAY USING LOGIC GATES

CROSS REFERENCE TO RELATED APPLICATIONS

This application claims priority to European Patent Application No. 22201697.4 of Oct. 14, 2022, the entire contents of which are incorporated herein by reference.

FIELD OF THE INVENTION

In one aspect the present disclosure relates to a memory cell array and in particular to an address decoder unit for a memory cell array. In another aspect the present disclosure relates to a method of selecting numerous and variable address selection outputs of an address decoder unit at a time.

BACKGROUND OF THE INVENTION

System on a chip (SOC) systems often contain a CPU and several different memories needed for the CPU operation, like RAM, ROM with bootloader and NVM for the firmware, user program code and data. A NVM memory can be typically erased and re-programmed by the user while the code in the ROM is kept non-eraseably. Some area for the trimming words is also needed. It is usually stored in NVM memory and it is not supposed to be deleted by a customer.

The bootloader ensures that the system in the application can be always rebooted with a minimal setup thus enabling a reprogramming to e.g. obtain the full application software from an external download. Bootloader software is typically be used for a software update in the application. Having the bootloader in the ROM memory increases the cost of changing of the bootloader software. It is also the additional block which needs to be connected on the chip.

Generally, it would be desirable to have only one memory (NVM) which could contain bootloader and used code. In such case, the software will transfer the code for program transfer and flash write in the RAM and execute the software update from the RAM. This procedure will erase the Flash and write the new code. In case of a power-down during the software update, the software will be corrupted and the system will not be able to reboot.

US2008155217 describes a system, wherein part of a memory area is protected for read operations.

A memory cell array, such as a non-volatile memory can be split into at least two parts or sections. A bootloader section and a firmware section. In case of conducting a software update it would be beneficial to delete only the firmware section while leaving the bootloader section unaffected. In this context it would be beneficial to be able to delete the firmware section by a single mass erase command. It would be further beneficial to provide a configurable border or separation between the firmware section and the bootloader section and hence to provide a configurable beginning of the firmware section. This way there could be provided sufficient memory for the boot loader section whilst avoiding to waste memory.

SUMMARY OF THE INVENTION

The above demands and problems will be solved by an address decoder unit, an electronic device and by a method in accordance to the features of the independent claims. Further features of the invention are subject matter of the dependent claims.

In one aspect there is provided an address decoder unit for a memory cell array, such as a non-volatile memory. The address decoder unit comprises an address decoder comprising an address input and a number of address outputs. The address decoder is operable to select one of the address outputs in response to receive a memory address at the address input. Typically, the address decoder is operable to select only one of the address outputs in response to receive a memory address at the address input. In other words, the address decoder translates a memory address received at the address input into the selection of a dedicated address output, which is connectable to a corresponding address space, such as an memory line, a word line or a memory cell or bit of the memory cell array.

The address decoder unit further comprises an address selection circuitry. The address selection circuitry is connected to the address decoder and comprises a number of address selection outputs each of which connectable to the memory cell and each of which corresponding to one memory address. Typically, the number of address selection outputs is equal to the number of address outputs of the address decoder.

The address decoder unit is switchable into a memory erase mode. In the memory erase mode the address selection circuitry is operable to select all address selection outputs of an address space above or beyond a memory address provided at the address input.

For instance, and with a 3-bit address comprising 8 ($=2^3$) individual addresses there will be provided 8 address outputs of the address decoder as well as 8 address selection outputs of the address selection circuitry. If for instance there is provided a memory address at the address input, such as the first address, the address selection circuitry is then operable to select all available address selection outputs to provide a mass erase operation, e.g. via a row driver connected to the memory cell array.

With other configurations and where for instance a third memory address is received at the address input only a single, namely a third address output will be selected by the address decoder. The address selection circuitry may then in turn select all available address selection outputs and respective memory cells, memory lines or memory columns will be selected for a mass or multiple erase operation that are located adjacent to that particular address selection output that corresponds to the selected address output of the address decoder.

In this way the address decoder unit provides a twofold functionality. First of all, the address decoder unit enables a mass selection of a number of memory cells, are memory lines or memory columns at a time. Second, the mass selection of numerous memory cells, memory lines or memory columns is modifiable and depends on the memory address provided at the address input of the address decoder.

Moreover, for the address decoder unit a rather conventional address decoder can be used. Hence, given designs of known address decoders can be generally used and can be equipped with the above-described address selection circuitry thereby expanding the functionality of an address decoder unit.

The solution proposed is able to erase only user area while keeping the bootloader area of a memory cell array substantially untouched. In this case, the bootloader will never be corrupted and in case of power down, the system will be able to reboot from bootloader in the Flash. The erase of the entire user area can be provided by a single erase command to save time during the (re)-programming of the device. Also here, the size of the bootloader might change depending on the application. This is typically solved on the system level, where the system does not allow to the user erase the path of the NVM which contains the bootloader According to a further example the address selection circuitry is operable to select all address selection outputs of an address space above or below a memory address provided at the address input. The address selection circuitry is further operable to unselect all address selection outputs of an address space below or above the memory address provided at the address input. In particular, the address selection circuitry is operable to select all address selection outputs of an address space above a given memory address provided at the address input and is further operable to unselect all address selection outputs of the address space below this particular memory address.

In this way and in the same or likewise manner the address selection circuitry may be operable to unselect all address selection outputs of an address space above the memory address provided at the address input and is further operable to select all address selection outputs of the address space below the memory address provided at the address input.

For instance if there is provided a 3 bit address space with addresses from 0, 1, 2, . . . 7 and if the address input is e.g. indicative of address 2, only 3 of the address selection outputs will be at a logic 0 whereas all other address selection outputs of the address selection circuitry will be at a logic 1.

With another example and with an address input of e.g. 5, six consecutive or adjacently located address selection outputs will be at logic 0 whereas two remaining consecutive address selection outputs will be at a logic 1.

Typically, the address decoder unit, in particular the address selection circuitry is operable to translate a given memory address into a configurable or variable beginning of a firmware section of the memory cell array. The address selection circuit is further operable to select all adjacently located memory cells, memory lines or memory columns for a subsequent erase operation.

According to a further example the address selection circuitry comprises a number of logic gates. Each logic gate comprises a first gate input, a second gate input and a gate output. Each logic gate is connected with two of the address selection outputs. Typically, the logic gates of the number of logic gates are arranged in a chain-like or serial configuration. Typically, an output of a first logic gate is provided at a first gate input of a consecutive logic gate, i.e. a second logic gate.

The gate output of the consecutive logic gate is connected to a gate input of a further consecutive logic gate and so on. In this way, activation or selection of a particular address output of the address decoder may be easily transferred to or consecutive address selection outputs of the address selection circuitry. Typically, the total number of logic gates provided by the address selection circuit is equal to a number N−1, with N being the number of address outputs of the address decoder.

With some examples the first address output of the address decoder is connected or corresponds to a first address selection output. A second address output is connected to the second address selection output via a first logic gate. Here, the second address output of the address decoder may be connected to a second address selection output of the address selection circuitry via a first logic gate.

A third address output of the address decoder is connected to a third address selection output of the address selection secretary via a second logic gate, and so on. In a chain or serial connection between individual logic gates of the address selection circuitry it may be provided that the gate output of e.g. a first logic gate is connected to the first gate input of a consecutive, and hence of a second logic gate. Moreover, the gate output of the second logic gate of the address selection circuitry may be connected to a first gate input of a third logic gate of the address selection circuitry. The second gate input of the logic gate may be directly or indirectly connected to respective address output of the address decoder.

Here, a second gate input of the first logic gate may be connected to a second address output of the address decoder. A second gate input of the second logic gate may be connected to a third address output of the address decoder; and so on.

With some examples the first address selection output of the address selection circuitry may be directly connected to the first address output of the address decoder. It may be connected to the first address output via a digital buffer.

By way of a number of logic gates each of which comprising a first and a second gate input, wherein each logic gate is connected with two of the address selection outputs there can be provided a mutual coupling between neighboring address selection outputs such that setting of one of the address selection outputs to a logic high level induces a respective switching or setting of neighboring address selection outputs to a logic high level as well. This way, a mass selection of memory cells, memory lines or memory columns of the memory cell array can be provided.

According to a further example the first gate input of a first logic gate of the address selection circuitry is connected to a first address output of the address decoder. The second gate input of the first logic gate is connected to a second address output of the address decoder. The gate output of the first logic gate is connected to or forms a second address selection output of the address selection circuitry.

This way, the first logic gate is driven by the first address output as well as by the second address output. The first address output and the second address output can be mutually combined or coupled. In general, switching of the first address output from logic low to logic high may be simply gated to the first address selection output. The switching of the first address output of the address decoder from logical low to logical high may also induce a switching of the first logic gate, in particular it may induce a switching of the gate output of the first logic gate from a logical low to a logic high value.

In this way, selection of a dedicated address output may induce a kind of a chain reaction by way of which neighboring address outputs, in particular neighboring address selection outputs of the address selection circuit, are switched for selected as well.

According to a further example a first gate input of a second logic gate of the address selection circuitry is connected to the gate output of the first logic gate. The second gate input of the second logic gate is further connected to a third address output of the address decoder. The gate output of the second logic gate is further connected to or forms a third address selection output of the address selection circuitry.

With further examples the above described connection or configuration of first and second address outputs of the address decoder with gate input of first and second logic gates and be equally transferred to a larger number of logic gates. Typically, each address output of the address decoder is mapped or connected to a single logic gate and is connected to the second gate input of the respective logic gate.

The first gate input of the respective logic gate is connected to the gate output of a preceding logic gate of the address selection circuitry. In this way there can be provided a chain-like serial connection between the logic gates of the address selection circuitry, which provides and enables a mass selection of numerous memory cells, memory lines or memory columns of the memory cell array.

According to a further example each logic gate of the address selection circuitry is operable to set its gate output to a logic high level when at least one of the first gate input and the second gate input is at a logic high level. With some examples the logic gates of the address selection circuitry each comprise a logic OR gate. Implementation of a logic OR gate for the individual logic gates of the address selection circuitry is rather simple, cost-efficient and space saving.

According to a further example each one of the logic gates of the address selection circuitry comprises an enabling input by way of which operation of the respective logic gate can be activated or deactivated. Typically, when the enabling input is at a logic high level, the logic gate is activated. When the enabling input is at a logical low level the respective logic gate is effectively deactivated. With a deactivated logic gate the respective logic gate only provides a gating of its gate input to the gate output. Here, and in the deactivated state the logic gate may only act or behave as a buffer.

When the logic gates are activated, e.g. by setting the enabling inputs to a logic high level the logic gates each start to operate in a manner as described above.

Typically, by switching the enabling input to a logic high value or level the address decoder unit is switched into a memory erase mode. By switching the enabling inputs to a logic low level the address decoder unit is switched into a normal operation mode, which may be a read mode and/or a write mode.

According to a further example and when a dedicated logic gate of the number of logic gates is deactivated, a gate output of the dedicated gate is at the same logic level than a second gate input of the dedicated logic gate. This way, the address output of the address decoder is gated through the dedicated logic gate. As a consequence, the address selection output of the dedicated logic gate will be at the same logic level as the address output of the address decoder connected to the dedicated logic gate. Hence, when a logic gate of the address selection circuitry is deactivated, e.g. by setting the enabling input to a logic low level the address selection circuitry is substantially effectless and has no impact on the operation of address decoding and memory cell selection. It primarily upon setting the address decoder unit into the memory erase mode that the dedicated logic gate or that all logic gates of the address selection circuitry start to operate as described above, thus providing a mass selection and hence a mass erasing of numerous selected memory cells, memory lines or memory columns at a time.

According to a further example the enabling inputs of the number of logic gate are mutually connected. In this way, all logic gates of the address selection circuitry can be synchronized. Enabling one of the logic gates of the address selection circuitry equally transfers to a respective state or mode of operation of all other logic gates of the address selection circuitry. The synchronous activation or deactivation of all available logic gates of the address selection circuitry enables the above-described mass selection of numerous lines or columns of the memory cell array, e.g. for an erase operation.

According to a further example at least one of the logic gates of the address selection circuitry comprises a logic AND gate and further comprises a logic OR gate. Here, an output of the logic OR gate is connected to or forms the gate output. A first input of the logic OR gate is further connected to an output of the logic AND gate.

By the logic AND gate that can be provided a selective activation or deactivation of the respective logic gate. Typically, the enabling input may be connected to an input of the indicator. The logic OR gate of the logic gate of the address selection circuitry may be directly or indirectly connected to an address output of the address decoder and to an address selection output of a neighboring logic gate, respectively.

This way and in particular by the logic AND gate there can be provided a selective switching of the address decoder unit into the memory erase mode or a switching between the memory erase mode and a conventional mode of operation, such as a write mode or read mode.

According to a further example a second input of the logic OR gate is connected to the second gate input of the logic gate. A first input of the logic AND gate is connected to the first gate input of the logic gate. By connecting the second input of the logic OR gate to the second gate input of the logic gate there can be provided a direct connection between the address output of the address decoder and the respective logic OR gate since the second gate input of the logic gate is connected to the respective address output of the address decoder.

By connecting the first input of the logic AND gate to the first gate input of the logic gate the logic AND gate of an N-th logic gate of the address selection circuitry can be connected to the gate output of an N−1-th logic gate of the address selection circuitry. In this way, there can be provided a kind of a chain connection between the numerous logic gates of the address selection circuitry by way of which a mass or group selection of numerous memory cells, memory lines or memory columns can be provided.

According to a further example of the address decoder unit the second input of the logic AND gate is connected to the enabling input. In this way, the output of the gate, which may be connected to the first input of the logic OR gate is only at a logic high value when both, the enabling input is at a logic high-level and when the output gate of a preceding logic gate is at the logic high level.

By connecting the enabling input to the logic gate and/or by connecting the enabling input to the input of the logic AND gate, the respective operation of the logic OR gate of the numerous logic gates can be selectively activated and deactivated.

This way and by providing the logic gates of the address selection circuitry with a logic AND gate and with a logic OR gate the address decoder unit can be switched between a memory erase mode and one of a memory write mode or memory read mode.

According to a further example the address decoder unit is switchable into a memory read mode or memory write mode, in which the address selection circuitry gates the address output of the address decoder to a corresponding address selection output. Typically, the number of address selection outputs of the address selection circuitry equals the number of address outputs of the address decoder.

When in the memory read mode or memory write mode, e.g. when the enabling input of all logic gates of the address selection circuitry is at a logic low level the address selection circuitry is substantially effectless and simply gates the output signals as provided at the individual address outputs of the address decoder through the address selection circuitry and hence to the respective address selection outputs thereof.

However and when in the memory erase mode, which is typically activated by setting the enabling input of all logic gates of the address selection circuitry to a logic high level the memory address as provided at the address input of the address decoder leads to a single selection of one of the address outputs. The selection of only one address output of the address decoder is then transferred by the address selection circuitry into the selection of a number of address selection outputs, which may be located adjacent to each other.

In a further example the address decoder unit is switchable into the memory read mode or memory write mode by setting the enabling input to logic zero.

With other examples the enabling input may be inverted. Here, setting of the address decoder unit into the erase mode may be obtained by setting the enabling input to logic zero. Setting or switching the address decoder unit into the memory read mode or memory write mode may be obtained by setting the enabling input to a logic high level or logic high value.

In a further aspect the present disclosure also relates to an electronic device comprising a memory cell array and further comprising an address decoder unit as described above. The electronic device may be implemented as a mobile electronic device. It may be implemented as a battery driven electronic device and/or as a portable electronic device. Generally, and by way of the address decoder unit the system and a shape of a respective electric circuit or system on a chip can be simplified and may be void of any ROM memory. It may be entirely implemented as non-volatile memory (NVM). Moreover, and by the mass selection of individual memory cells, erase operations of numerous memory lines or memory columns can be conducted faster and more efficient.

In another aspect the present disclosure relates to a method of selecting numerous address selection outputs of an address decoder unit as described above. Here, and after providing the address decoder unit a memory address is provided at the address input of the address decoder. this is typically processed by the address decoder thus generating and providing a memory selection signal on only one of the address outputs of the address decoder.

Based on the address output the address selection circuitry then selects all address selection outputs of an address space adjacent and above or beyond the memory address provided at the address input.

The method is typically conducted by an address decoder unit as described above. Insofar all features, effects and benefits as described above in connection with the address decoder unit equally apply to the method of selecting numerous address selection outputs of an address decoder unit at a time.

BRIEF DESCRIPTION OF THE DRAWINGS

In the following, numerous examples of an address decoder unit are illustrated in greater detail by making reference to the drawings, in which.

DETAILED DESCRIPTION

Figure 1:
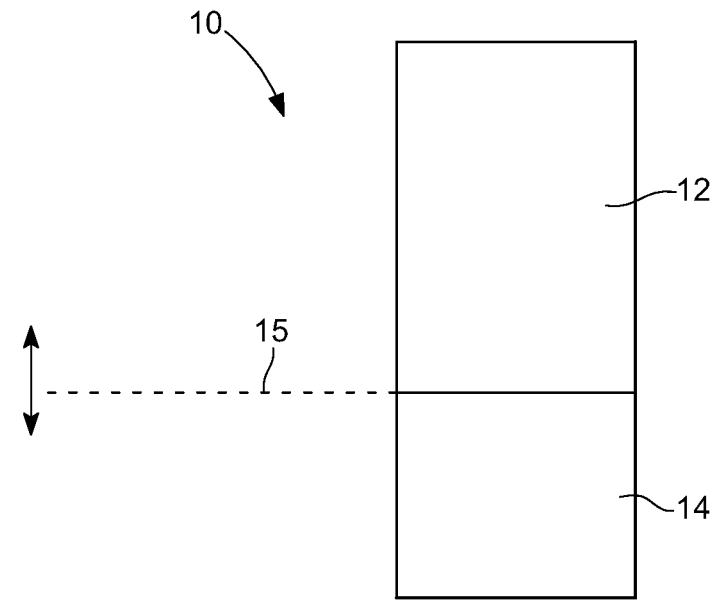
FIG. 1 schematically illustrates a memory cell array with a firmware section and a boot loader section, FIG. 2 schematically illustrates an address decoder unit connected to a row driver and connected to a memory cell array.

FIG. 1 shows a memory cell array 10, which is divided in a firmware section 12 and a boot loader section 14. Between the boot loader section 14 and the firmware section 12 there is provided and illustrated a logical border indicating the beginning 15 of the firmware section 12. As will be described below in greater detail the beginning 15 of the firmware section 12 is modifiable and can be reconfigured in accordance to given or variable demands and/or in accordance to the size of the data or software to be stored in the firmware section 12 or bootloader section 14.

Figure 2:
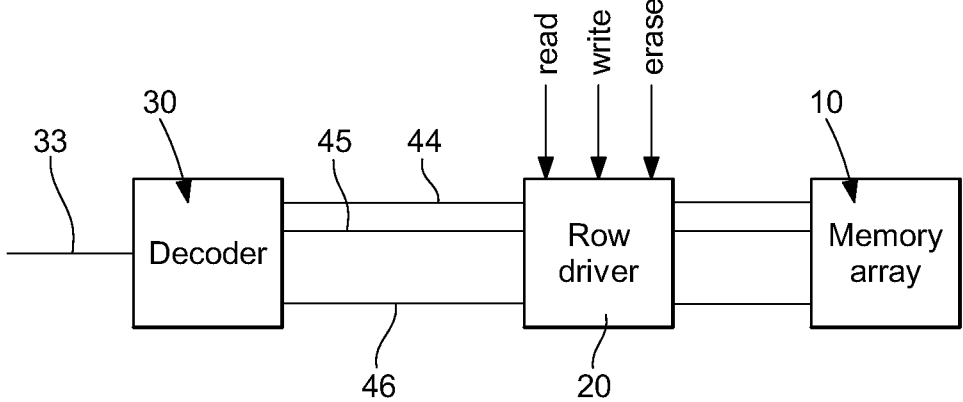

The memory cell array 10 is typically controlled by a row driver 20, which is connected to the memory cell array 10 as illustrated in FIG. 2. For selecting individual lines, elements or cells of the memory cell array for a read operation, for a write operation and/or for an erase operation there is provided an address decoder 30 connected to the row driver. The address decoder 30 typically comprises an address input 33, which receives a memory address, which is decoded by the address decoder 30.

The address decoder unit 30 comprises numerous address selection outputs 44, 45, 46, each of which connected or connectable to a well-defined portion or section of the memory cell array 10. For instance, an address selection output 44 may be connected or maybe connectable to a first line of the memory cell array 10. A second address selection output 45 may be connected or maybe connectable to a second line of the memory cell array 10 and a further address selection output 46 may be connected or maybe connectable to a further line of the memory cell array 10.

Figure 3:
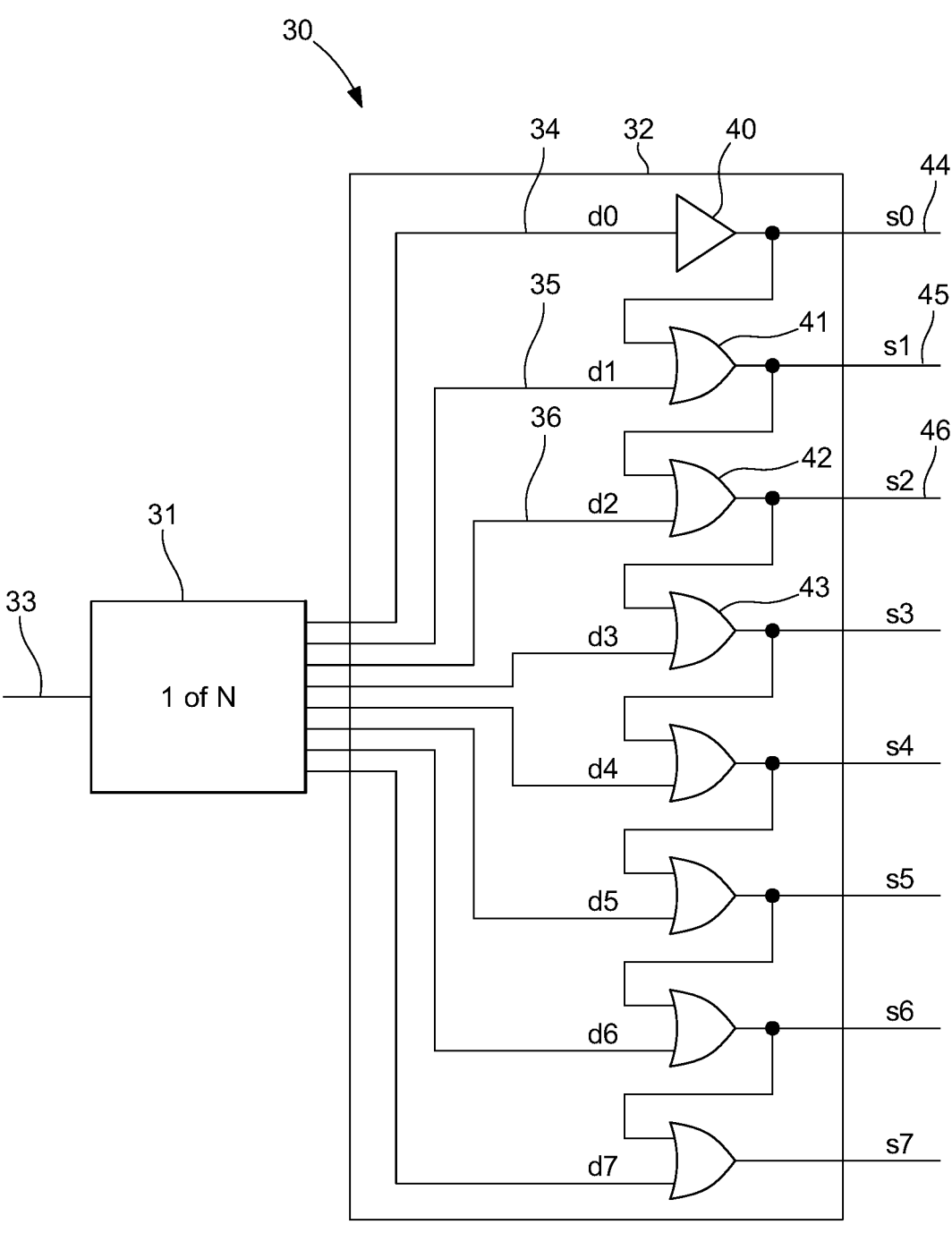
FIG. 3 illustrates one example of an address decoder according to the present invention, FIG. 4 schematically illustrates the address decoder unit according to FIG. 3 in a more detailed illustration, FIG. 5 schematically shows a detail of a logic gate of the address decoder unit as illustrated in FIG. 4, and FIG. 6 schematically illustrates a flowchart of a method of selecting numerous memory cells or memory lines of a memory cell array by making use of the address decoder unit.

In FIG. 3 there is provided a more detailed block diagram of an example of the address decoder unit 30. The address decoder unit 30 comprises an address decoder 31. The address decoder 31 comprises an address input 33 and further comprises a number of address outputs 34, 35, 36. Each one of the address outputs 34, 35, 36 is connected to only one of the address selection outputs 44, 45, 46 of the address decoder unit 30. The address decoder unit 30 comprises an address selection circuitry 32. The address selection circuit circuitry 32 comprises a number inputs, each of which connected to one of the address outputs 34, 35, 36 connected to the address decoder 31.

The address selection outputs 44, 45, 46 are provided as outputs of the address selection circuitry 32. They may coincide or may constitute respective address selection outputs of the address selection unit 30.

The address selection circuitry 32 is logically illustrated in FIG. 3. It may comprise or may consist of a number of logic gates 41, 42, 43. In effect, the address selection circuitry 32 provides a gating of the signals provided at the address outputs 34, 35, 36 to the address selection outputs, 44, 45, 46, respectively.

The address decoder unit 30 is switchable into a memory erase mode. Here, the address selection circuitry is operable to select all address selection output 44, 45, 46 of an address space above or beyond a memory address provided at the address input 33.

With the example as illustrated in FIG. 3 a first address output 34 is connected to a first address selection output 44 via a digital buffer 40. The buffer 40 may be provided only optionally. Hence, a signal at the address selection output 44 is typically identical to a signal as provided at the address output 34.

A second address output 35 is connected to a first logic gate 41 of the address selection circuitry 32. Here, the first logic gate 41 may comprise or may be implemented as a logic OR gate, with a first gate input 51 connected to the first address selection output 44 and with a second gate input 52 connected to the second address output 35 of the address decoder 31.

A second logic gate 42 of the address selection circuitry 32 is connected in a chain-like manner to the first logic gate 41. Here, a first input gate 51' of the second logic gate 42 is connected to the gate output 55 of the first logic gate 41. A second input gate 52' of the second logic gate 42 is further connected to the third address output 36 of the address decoder 31.

The gate output 55 of the first logic gate 41 is connected to or forms or constitutes the second address selection output 45. The gate output 55' of the second logic gate 42 is connected to or forms or constitutes the third address selection output 46.

The series of first and second logic case 41, 42 may continue in a likewise manner, depending on the number of address outputs 24, 25, 26 of the address decoder 31.

With the example of FIG. 3 there is illustrated a 3-bit address configuration. Accordingly, the address decoder 31 comprises 8 (=2³) individual address outputs 34, 35, 36, i.e. d0-d7. The address selection circuitry 32 comprises an equal number of address selection outputs 44, 45, 46, i.e. s0-s7.

Figure 4:
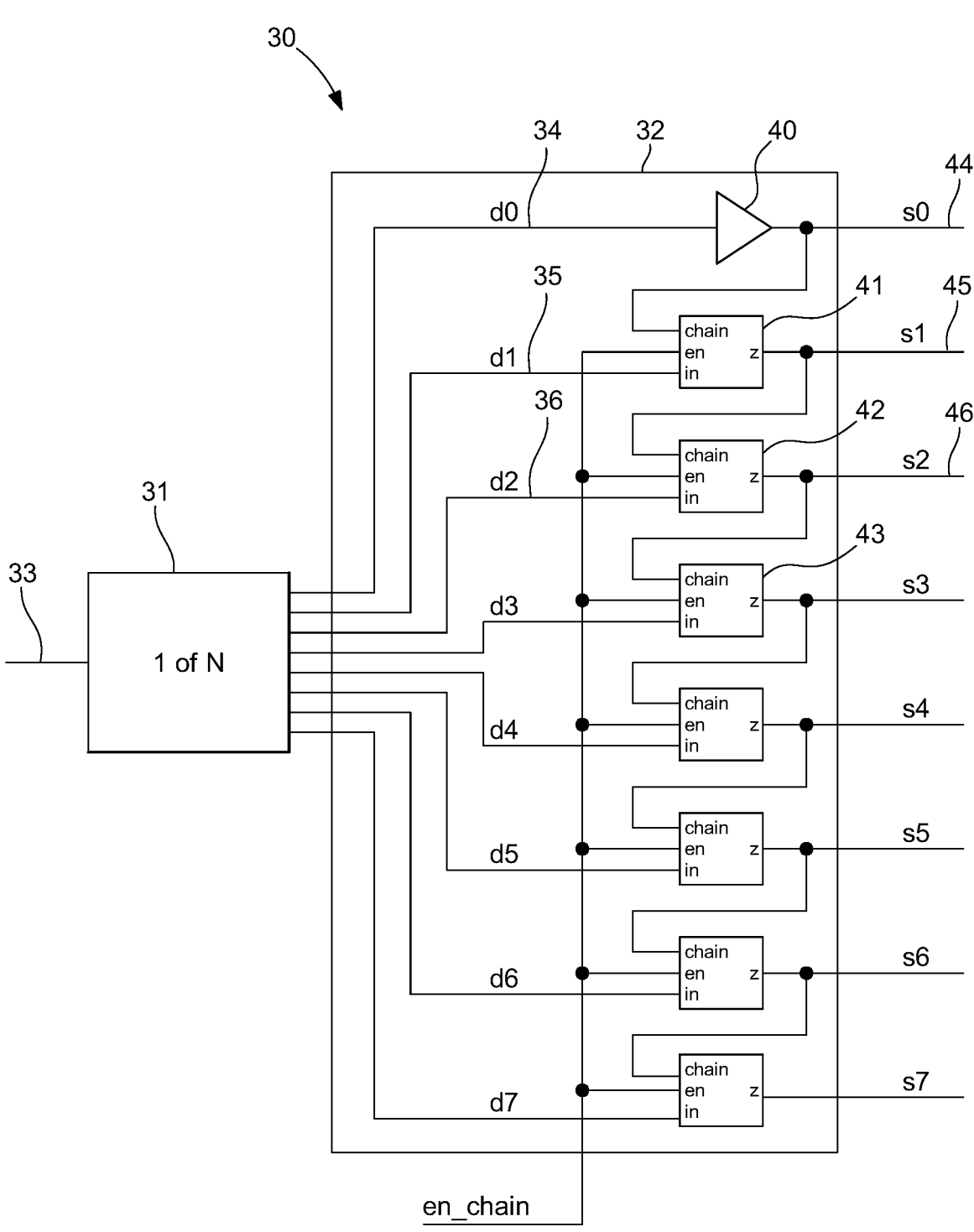
Figure 5:
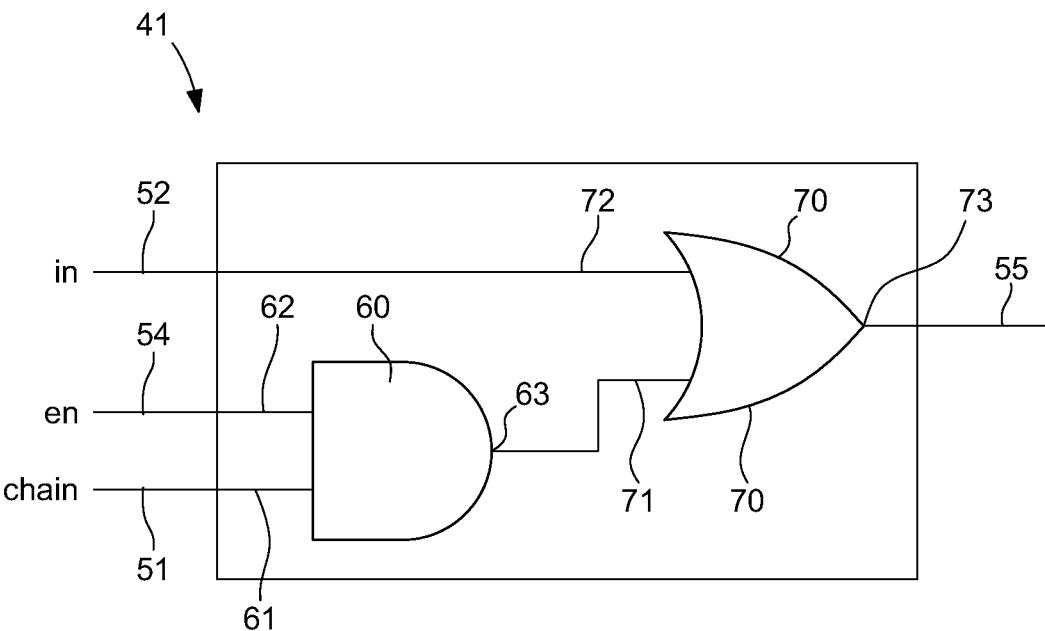

With the presently illustrated example of FIGS. 3-5 the individual logic gates 41, 42, 43 of the address selection circuitry 32 may be implemented as logic OR gates or may at least comprise a logic OR gate.

With the example of FIG. 3, wherein the logic gates 41, 42, 43 are implemented as logic OR gates the address decoder unit 30 may be permanently in a memory erase mode. Insofar the example of FIG. 3 is void of a selective activation or deactivation of the logic gates 41, 42, 43.

Operation of the address decoder unit 30 is exemplary described further below with the example of a bit address according to the following table.

| Address | Decoded address [d7 to d0] | Selected line [s7 to s0] |
| --- | --- | --- |
| 0 | 00000001 | 11111111 |
| 1 | 00000010 | 11111110 |
| 2 | 00000100 | 11111100 |
| 3 | 00001000 | 11111000 |
| 4 | 00010000 | 11110000 |
| 5 | 00100000 | 11100000 |
| 6 | 01000000 | 11000000 |
| 7 | 10000000 | 10000000 |

The 3-bit address comprises address numbers from 0 to 7 each one of which corresponding to a decoded dy-d0. For instance, and with a memory address of 0 present at the address input 33 of the address decoder 31, only the first address output 34 will be at a logic high level. All other address outputs 35, 36 and hence the address output d1-d7 as illustrated in FIG. 3 will be at a logical low level or at logic 0.

With the address output 34 at a logic high-level and with the pair-wise connection of the individual logic gates 41, 42, 43 only the first address selection output 44 will be initially at logic 1, which leads to the configuration that also all other address selection outputs 45, 46 and hence all address selection outputs s7-s0 will be at logic high level.

This is achieved since the first gate input 51 of the first logic gate 41 is connected to the first address selection output 44. If the signal at the first address selection output 44 is at a logic high-level also the signal of the second address selection output 45 as provided at the gate output 55 of the first logic gate 41 will be also at the logic high level and so on. The first gate input may be also denoted as a chain input since it takes part in the serial or chain-like connection of the individual logic gates 41, 42, 43.

As illustrated in the logic table above and depending on a single memory address as provided at the address input 33 there will be provided a kind of a mass selection of numerous selected lines s0-s7 and of the respective address selection outputs 44, 45, 46 of the address selection circuitry 32 at a time.

In order to selectively switch the address decoder unit 30 into the memory erase mode and in order to provide a memory read mode or memory write mode, in which the memory address as provided at the address input 33 should result in the selection of only one selected line of all available lines s0-s7 the individual logic gates 41, 42, 43 may be selectively transferred into a deactivated state.

This can be obtained by the example of FIGS. 4 and 5. Here and as illustrated in greater detail the logic gates 41, 42, 43 each comprise a logic AND gate 60 and a logic OR gate 70. The logic gates 41, 42, 43 are also provided with a supplemental and additional enabling input 54, which is also denoted an "en" or "en_chain". If the enabling input 54 is at a logic low level the respective logic gate 41 will be rather inactive and simply provides transmission of a signal as received at the second gate input 52 towards the gate output 55.

Only in case that the enabling input 54 is at a logic high-level the address selection circuitry 32 becomes active and enables and provides a mass selection of a number of pills or lines of the memory cell array 10.

With the example of FIGS. 4 and 5 the logic AND gate 60 comprises an output 63 connected to the first input 71 of the logic OR gate 70. The second input 72 of the logic OR gate 70 is connected to the second gate input 52. The enabling input 54 and the first gate input 51 are connected to respective inputs 61, 62 of the logic AND gate 60. The output 73 of the logic OR gate 70 is connected to or forms or constitutes the gate output 55 of the logic gate 41.

In situations, wherein the enabling input 54 is low also the output 63 of the logic AND gate 60 is low. Hence, there is provided a logic low level at the input 71 one of the logic OR gate 70. Consequently, the input signal as provided at the gate input 52 will be gated through the respective logic gate 41 and will be e.g. unalterably provided at the gate output 55.

With the enabling input 54 being at a logic high level a value the output 63 of the logic AND gate is entirely governed or controlled by the gate input 51. If the gate input 51 is at a logic low level also the output 63 will be at the logic low level. If the first gate input 51 is at the logic high-level the same applies to the output 63 of the logic AND gate 60. Only when both inputs 61, 62 of the logic AND gate 60 are at a logic high value the output 63 of the logic AND gate 60 will be also at a logic high value. Accordingly, the input 71 of the logic OR gate 70 is at the logic high value, which always provides a logic high value at the output 73 of the logic OR gate as well as the gate output 55.

Here and for each signal at the second gate input 52 the gate output 55 will be at the logic high value thus providing and enabling the mass selection of a consecutive or adjacently located number of lines of the memory cell array 10.

As further illustrated in FIG. 4 the individual enabling inputs 54 of the number of logic gates 41, 42, 43 of the address selection circuitry 32 are mutually connected. They are arranged in series so that the logic gates 41, 42, 43 of the address selection circuitry 32 are synchronously switched between an activated or deactivated stage.

In the deactivated state the address selection circuitry 32 is rather inactive. Here, signals provided on one of the address outputs 34, 35, 36 or address outputs d0-d7 will be unalterably gated through the address selection circuitry 32 and will be present at the respective address selection outputs 44, 44, 46, hence at the respective select certain outputs as s0-s7. By switching the enabling input 54 to the logic high value the address selection circuitry 32 becomes active. Then, and depending on the specific memory address as provided at the address input 33 there will be provided one logic high signal on one of the address outputs 34, 35, 36 and hence at only one of the 8 available address output d0-d7.

As illustrated by the above table the respective logic decoded address at the d0-d7 would then leads to an accumulative high logic level output on the respective selected lines that are adjacent to that logic gate 41, 42, 43, which receives the logic high-level at its second gate input 52.

Figure 6:
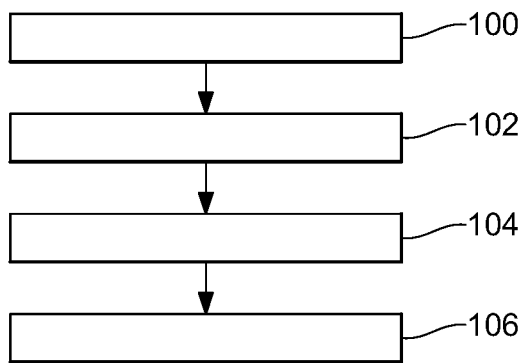

In FIG. 6, there is further illustrated a flowchart of executing or conducting a method of selecting numerous and selection outputs of an address decoder unit 30 in conjunction with the examples as described above. Here, and in a first step 100 the address decoder unit 30 is provided. In a subsequent step 102 a memory address is provided and the address input 33 of the address decoder 31. In a further step 104 there is generated and provided a memory selection signal, which is typically a signal of high logic level, on one of the address outputs of the address decoder in response to receive the memory address at the address input.

In a further step 106 all address selection outputs of an address space above or beyond a memory address provided at or defined by the address input are selected. Here, the number of address selection outputs 44, 45, 46 located adjacent to a dedicated address selection output that corresponds to the address output of the address decoder is selected thereby enabling a mass selection of numerous address selection outputs of the address selection circuitry, and hence of the address decoder unit.

Generally, the method of mass selection of numerous portions of the memory cell array is to be conducted by an address decoder unit as described above. Insofar all features, effects and benefits as described above in connection with the address decoder unit equally apply to the method of address selection.

REFERENCE NUMBERS

10 memory array
20 row driver
30 address decoder unit

31 address decoder
32 address selection circuitry
33 address input
34 address output
35 address output
36 address output
40 buffer
41 logic gate
42 logic gate
43 logic gate
44 address selection output
45 address selection output
46 address selection output
51 gate input
52 gate input
54 enabling input
55 gate output
60 AND gate
61 gate input
62 gate input
63 gate input
70 OR gate
71 gate input
72 gate input
73 gate output

The invention claimed is:

1. An address decoder unit (30) for a memory cell array (10), the address decoder unit (30) comprising:
    an address decoder (31) comprising an address input (33) and a number of address outputs (34, 35, 36), the address decoder (31) being operable to select one of the address outputs (34, 35, 36) in response to receive a memory address at the address input (33), the one selected address output designating one memory cell among the memory cell array (10); and
    an address selection circuitry (32) connected to an output of the address decoder (31) and comprising a number of address selection outputs (44, 45, 46) each of which connectable to the memory cell array (10) and each of which corresponding to one memory address designating one memory cell among the memory cell array (10),
    wherein the address decoder unit (30) is switchable into a memory erase mode, in which the address selection circuitry (32) is operable to:
        input the one address output selected by the address decoder (31), and
        based on the one address output selected by the address decoder (31), select all address selection outputs (44, 45, 46) corresponding to memory addresses designating memory cells that are either above or below the memory address provided at the address input (33) of the address decoder (31).

2. The address decoder unit (30) according to claim 1, wherein the address selection circuitry (32) is further operable to unselect all address selection outputs (44, 45, 46) corresponding to memory addresses designating memory cells that are either below or above the memory address provided at the address input (33).

3. The address decoder unit (30) according to claim 1, wherein the address selection circuitry (32) comprises a number of logic gates (41, 42, 43) each of which comprising a first gate input (51), a second gate input (52) and a gate output (55), wherein each logic gate (41, 42, 43) is connected with two of the address selection outputs (44, 45, 46).

4. The address decoder unit (30) according to claim 3, wherein the first gate input (51) of a first logic gate (41) of the address selection circuitry (32) is connected to a first address output (34) of the address decoder (31), wherein the second gate input (52) of the first logic gate (41) is connected to a second address output (35) of the address decoder (31) and wherein the gate output (55) of the first logic gate (41) is connected to or forms a second address selection output (45) of the address selection circuitry (32).

5. The address decoder unit (30) according to claim 4, wherein a first gate input (51') of a second logic gate (42) of the address selection circuitry (32) is connected to the gate output (55) of the first logic gate (42), wherein the second gate input (52') of the second logic gate (42) is connected to a third address output (36) of the address decoder (31) and wherein the gate output (55') of the second logic gate (42) is connected to or forms a third address selection output (46) of the address selection circuitry (32).

6. The address decoder unit (30) according to claim 3, wherein each logic gate (41, 42, 43) is operable to set its gate output (55) to a logic high level when at least one of the first gate input (51) and the second gate input (52) is at a logic high-level.

7. The address decoder unit (30) according to claim 3, wherein each one of the logic gates (41, 42, 43) comprises an enabling input (54) by way of which operation of the respective logic gate (41, 42, 43) can be activated or deactivated.

8. The address decoder unit (30) according to claim 7, wherein when a dedicated logic gate (41, 42, 43) of the number of logic gates (41, 42, 43) is deactivated, a gate output (55) of the dedicated logic gate (41, 42, 43) is at the same logic level than a second gate input (52) of the dedicated logic gate (41, 42, 43).

9. The address decoder unit (30) according to claim 7, wherein the enabling inputs (54) of the number of logic gates (41, 42, 43) are mutually connected.

10. The address decoder unit (30) according to claim 3, wherein at least one of the logic gates (41, 42, 43) comprises a logic AND gate (60) and a logic OR gate (70), wherein an output (73) of the logic OR gate (70) is connected to or forms the gate output (55) and wherein a first input (71) of the logic OR gate (70) is connected to an output (63) of the logic AND gate (60).

11. The address decoder unit (30) according to claim 10, wherein a second input (72) of the logic OR gate (70) is connected to the second gate input (52) of the logic gate (41) and wherein a first input (61) of the logic AND gate (60) is connected to the first gate input (51) of the logic gate (41, 42, 43).

12. The address decoder unit (30) according to claim 7, wherein a second input (62) of the logic AND gate (60) is connected to the enabling input (54).

13. The address decoder unit (30) according to claim 1, wherein the address decoder unit (30) is switchable into a memory read mode or memory write mode, in which the address selection circuitry (32) gates the address outputs (34, 35, 36) of the address decoder (31) to a corresponding address selection output (44, 45, 46).

14. An electronic device comprising a memory cell array (10) and further comprising the address decoder unit (30) according to claim 1 connected to the memory cell array (10).

15. A method of selecting numerous address selection outputs (44, 45, 46) of the address decoder unit (30) for the memory cell array (10) according to claim 1, the method comprises the steps of:

providing an address decoder unit (30), providing a memory address at the address input (33) of the address decoder (31), generating and providing a memory selection signal on one of address outputs (34, 35, 36) of the address decoder (31) in response to receiving the memory address at the address input (33), the one address output designating one memory cell among the memory cell array (10), inputting, by address selection circuitry (32) connected to an output of the address decoder (31), the memory selection signal on the one address output of the address outputs (34, 35, 36), and based on the memory selection signal, selecting, by the address selection circuitry (32), all address selection outputs (44, 45, 46) corresponding to memory addresses designating memory cells that are either above or below the memory address provided at the address input (33).

* * * * *